(12) United States Patent
Glashauser et al.

(10) Patent No.: US 6,375,549 B1
(45) Date of Patent: Apr. 23, 2002

(54) POLISHING HEAD FOR WAFER, AND METHOD FOR POLISHING

(75) Inventors: Walter Glashauser, Oberhaching; Lutz Teichgräber, Grimma; David Haggart; Katrin Ebner, both of Dresden, all of (DE)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/527,859

(22) Filed: Mar. 17, 2000

(51) Int. Cl.[7] .............................. B24B 1/00; B23B 31/28
(52) U.S. Cl. ........................... 451/41; 279/128; 451/63; 451/288; 451/290; 451/398
(58) Field of Search .................. 451/5, 41, 60, 451/63, 285, 287, 288, 289, 36, 37, 39, 398, 399, 397, 290; 279/128

(56) References Cited

U.S. PATENT DOCUMENTS

| 4,692,836 A | * | 9/1987 | Suzuki | 361/234 |
| 4,811,522 A | | 3/1989 | Gill, Jr. | 51/131.1 |
| 5,571,044 A | | 11/1996 | Bolandi et al. | 451/385 |
| 5,584,751 A | | 12/1996 | Kobayashi et al. | 451/288 |
| 5,643,061 A | | 7/1997 | Jackson et al. | 451/289 |
| 5,700,180 A | | 12/1997 | Sandhu et al. | 451/5 |
| 5,748,434 A | * | 5/1998 | Rossman et al. | 361/234 |
| 5,803,799 A | | 9/1998 | Volodarsky et al. | 451/288 |
| 5,807,165 A | * | 9/1998 | Uzoh et al. | 451/41 X |
| 5,857,899 A | | 1/1999 | Volodarsky et al. | 451/72 |
| 5,868,896 A | | 2/1999 | Robinson et al. | 156/344 |
| 5,879,226 A | | 3/1999 | Robinson | 451/287 |
| 5,904,611 A | | 5/1999 | Takahashi et al. | 451/41 |
| 5,911,619 A | * | 6/1999 | Uzoh et al. | 451/5 X |

FOREIGN PATENT DOCUMENTS

EP       0 706 854 A1    4/1996    ............ B24B/37/04

* cited by examiner

Primary Examiner—Timothy V. Eley (57) ABSTRACT

A polishing head (200) for a chemical-mechanical polishing machine that holds a semiconductor wafer (150) against a polishing pad (140) has a chuck (295) with a pressure chamber (210) to apply a down force substantially equally to the wafer backside (152). An electrode arrangement (270) within the chamber (210) is located coplanar to the wafer (150) to provide compensation to wafer or chuck irregularities by applying a compensation force having a distribution corresponding to the irregularities.

17 Claims, 5 Drawing Sheets

*— PRIOR ART —*

POLISHING HEAD FOR WAFER, AND METHOD FOR POLISHING

FIELD OF THE INVENTION

The present invention generally relates to an apparatus and a method for fabricating semiconductor wafers and, more particularly, to a polishing head used for chemical-mechanical polishing (CMP).

BACKGROUND OF THE INVENTION

Chemical-mechanical polishing ("CMP", "polishing" sometimes "planarization") processes remove material from the surface of a wafer in the production of ultra-high density integrated circuits. In a typical CMP process, a wafer is exposed to an abrasive medium under controlled chemical, pressure, velocity, and temperature conditions. Conventional abrasive media include slurry solutions and polishing pads. The slurry solutions generally contain small, abrasive particles that abrade the surface of the wafer, and chemicals that etch and/or oxidize the surface of the wafer. The polishing pads are generally planar pads made from a relatively porous material such as blown polyurethane, and the polishing pads may also contain abrasive particles to abrade the wafer. Thus, when the pad and/or the wafer moves with respect to the other, material is removed from the surface of the wafer mechanically by the abrasive particles in the pad and/or slurry, and chemically by the chemicals in the slurry.

For the application of CMP and for prior art designs, the following references are useful: U.S. Pat. No. 5,879,226 to Robinson ("Reference 1"); U.S. Pat. No. 5,868,896 also to Robinson ("Reference 2") and U.S. Pat. No. 5,643,061 to Jackson ("Reference 3").

Figure 1:
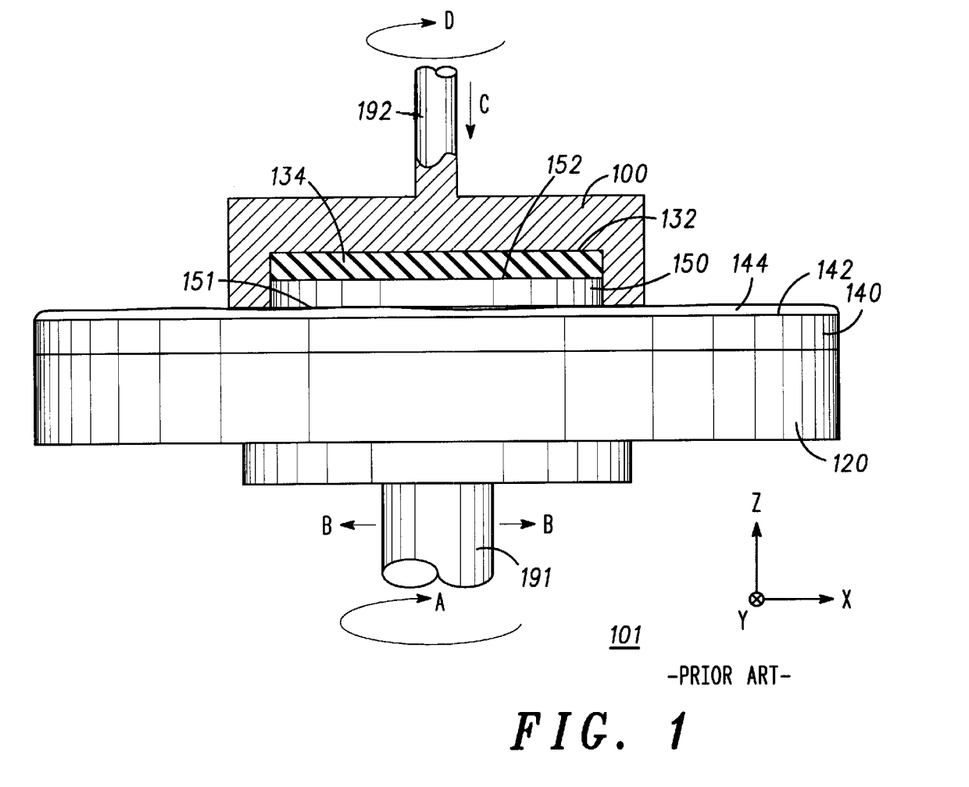
FIG. 1 illustrates a simplified diagram of a conventional chemical-mechanical polishing machine.

FIG. 1 illustrates a simplified diagram of a conventional CMP machine 101 with platen 120 (or "table"), wafer carrier 100 (or "polishing head"), polishing pad 140, and slurry 144 on polishing pad 140. Usually, drive assembly 191 rotates platen 120 as indicated by arrow A, or reciprocates platen 120 back and forth as indicated by arrow B. The motion of platen 120 is imparted to pad 140. For convenience of explanation, FIG. 1 introduces rectangular coordinate system XYZ with the X-axis going right, the Y-axis going into the page, and the Z-axis going up.

Wafer carrier 130 has lower surface 132 to which wafer 150 may be attached, or wafer 150 may be attached to resilient member 134 (e.g., a film) positioned between wafer 150 and lower surface 132. Member 134 prevents that head 100 directly touches backside 152 of wafer 150. Wafer carrier 100 may be a weighted, free-floating wafer carrier, or actuator assembly 192 may be attached to wafer carrier 100 to impart axial and rotational motion, as indicated by arrows C (Z-axis) and D, respectively.

In the operation of CMP machine 101, wafer 150 is positioned face-downward with frontside 151 against polishing pad 140. As frontside 151 of wafer 150 moves across planarizing surface 142, polishing pad 140 and slurry 144 remove material from wafer 150.

In the competitive semiconductor industry, it is desirable to maximize the throughput of the finished wafers and to minimize the number of defective or impaired devices on each wafer. The throughput of CMP processes is a function of several factors, one of which is the rate at which the thickness of the wafer decreases as it is being planarized (the "polishing rate").

CMP processes must consistently and accurately produce a uniform, planar surface on frontside 151 of wafer 150 because it is important to accurately focus the image of circuit patterns on frontside 151 in further fabrication steps. As the density of integrated circuits increases, it is often necessary to accurately focus the critical dimensions of the circuit pattern to better than a tolerance of approximately 0.01 micro meter. Focusing the circuit patterns to such small tolerances, however, is very difficult when the distance between the lithography equipment and the surface of the wafer varies because the surface of the wafer is not uniformly planar. In fact, several devices may be defective on a wafer with a non-uniformly planar surface. Thus, CMP processes must create a highly uniform, planar surface. In terms of the coordinate system, polishing provides a substantially constant elevation Z across the whole frontside 151 (Z independent from X and Y).

For achieving an accurate polishing result, polishing head 100 can be considered as the most critical part. Irregularities, especially on backside 152 of wafer 150 or member 134 may cause that head 100 presses wafer 150 to pad 140 non-uniformly, thus leading to unwanted non-uniform polishing.

The present invention seeks to provide an improved polishing head and a method which mitigate or avoid these and other disadvantages and limitations of the prior art.

DETAILED DESCRIPTION OF A PREFERRED EMBODIMENT

Preferred embodiments of the present invention are illustrated in the FIGS. wherein like numerals are used to refer to like and corresponding part of the various drawings.

For convenience, a prime marker indicates that a quantity (e.g., force F, pressure P, or area A) relates to a single portion of a wafer (cf. portions 153–155 in FIG. 2); wherein quantities that relate to the wafer as a whole are indicated without prime marker. In the FIGS., directions pointing into the page are indicated by a cross-in-circle ($\otimes$) symbol. The terms "up" and "down" are convenient abbreviations to indicated first and second directions, respectively, in the Z-coordinate.

In short, the present invention can be described as a polishing head (FIG. 2) for a chemical-mechanical polishing machine (FIG. 9) that holds a semiconductor wafer against a polishing pad. The head comprises a chuck (cf. chuck 295 in FIG. 2) with a pressure chamber (210 in FIG. 2) to apply a down force substantially equally to the wafer backside; and an electrode arrangement (cf. 270 in FIG. 2) within the chamber located coplanar to the wafer to provide compensation for irregularities (e.g., of wafer, chuck) by applying a compensation force (e.g., $F_3'$) having a distribution (i.e., $F_3'=f(X,Y)$) of partial forces corresponding to the irregularities. The invention is now explained in detail.

Figure 2:
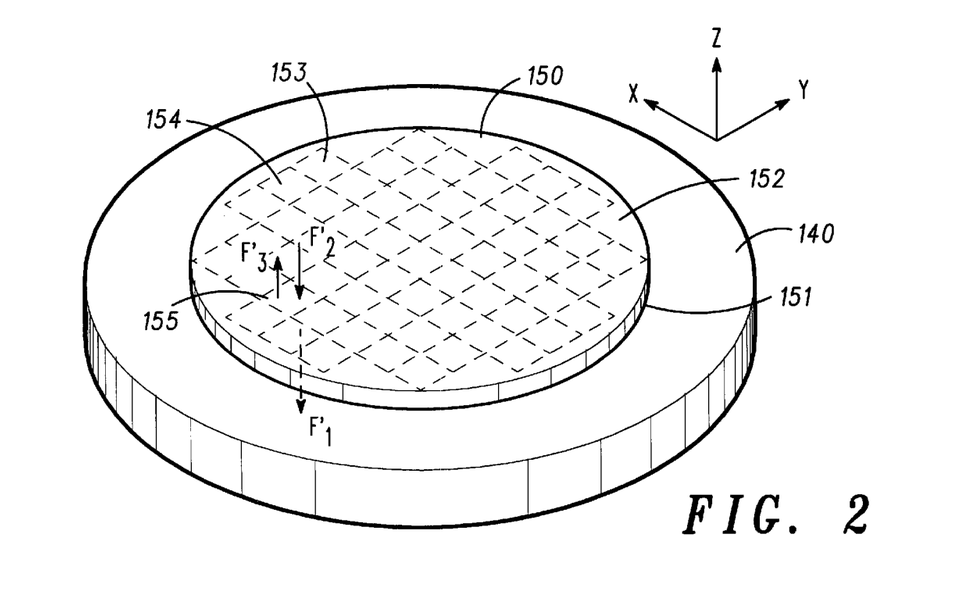
FIG. 2 illustrates a simplified view of a wafer having frontside and backside.

FIG. 2 illustrates a simplified view of semiconductor wafer 150 having frontside 151 and backside 152 (cf. FIG. 1). For convenience, FIG. 2 also illustrates the XYZ coordinates. The XY grid lines indicate portions 153–155 of wafer 150. The grid lines are not present physically and therefore shown dashed. Assume that each portion has an equal area A' that can be infinitesimal. Further assume that wafer 150 is fixed to a polishing head as explained in the background section and touches pad 140 with frontside 151. Explaining the present invention for a round wafer is convenient but not essential for the present invention. Persons of skill in the art are able, based on the teachings herein, to adapt the present invention for other wafer shapes without departing from its scope.

Forces F' and pressures P' are now illustrated for portion 155 which is representative for the other portions. Down force $F_2'$ (plain arrow opposite to Z-axis) is applied by the head to portion 155 (at backside 152); and portion 155 (at frontside 151) transfers the force as frontside force $F_1'$ (dashed arrow) to pad 140. $F_1'$ is also referred to as "polishing force". In the following description it is sometimes convenient to standardize the forces by referring to pressures P' (e.g., force F' per area A'), such as down pressure $P_2'$ and frontside or polishing pressure $P_1'$. Explaining in terms of pressure has the advantage that quantities become standardized and therefore independent from the area.

In order to uniformly remove material from frontside 151, it is desired to apply polishing force $F_1'$ to polishing pad 140 equally in each portion 153–155 of backside 152, that means independent from coordinates X and Y.

For an ideal wafer and an ideal head, down force $F_2'$ is substantially the same in each portion. Using the expression "not being a function of", this can be stated as:

$$F_2' \neq f(X, Y) \quad \text{(uniform down forces)} \tag{2}$$

$$\approx \text{constant} \tag{3}$$

Further, in an ideal case the forces are transferred to the pad uniformly, that is:

$$F_1' \approx F_2' \text{ (uniform transfer)} \tag{4}$$

However, a real wafer exhibits irregularities (at backside 152 and/or frontside 151) which prevent an uniform pressure transfer (cf. statement (4)). These irregularities might result, for example, from previous process steps applied to the wafer, from pre-layers, or from unwanted deposition of material. Persons of skills in the art can detect the irregularities as well as their coordinates without the need of further explanation herein.

According to a CMP machine of the prior art (e.g., FIG. 1), the head may not be able to provide the uniform down forces (cf. statement (2)). There is a variety of reasons. For example, it is difficult to uniformly compress member 134 (cf. FIG. 1). Or, if member 134 is a film that is, for example, changed with every batch of wafers, the quality of the film changes with every batch too. Further, slurry soaks can contaminate the film. In other words, local differences of the force $F_2$ (or pressure $P_2$) by which wafer 150 is pressed to pad 140 cause different local removal of material (different for each portion).

Hence, the above statements (2)(3)(4) are no longer valid and for the real wafer change to $$F_2' = f(X, Y) \quad \text{(non-uniform down forces)} \tag{6}$$

$$F_2' \neq F_2' \quad \text{(non-uniform transfer)} \tag{8}$$

According to the present invention, the problems are mitigated by, optionally, using a substantially contact-less force application of force $F_2'$ from head to wafer to approach a uniform down force (cf. statement (2)); and locally applying a further force $F_3'$ at least from wafer portion 155 counteracting force $F_2'$.

FIG. 2 illustrates force $F_3'$ (or pressure $P_3'$) by a plain arrow in the opposite direction to force $F_2'$. The amount of force $F_3'$ is smaller than the amount of $F_2'$, that is $$|F_3'| < |F_2'| \tag{10}$$

resulting in a reduction of force $F_1'$, that is $$|F_1'| = |F_2'| - |F_3'| \tag{12}$$

In other words, by locally creating forces $F_3'$, a substantially uniform application of force $F_1'$ from wafer 150 to pad 140 can be accomplished.

Even if the above mentioned conditions (2) and (4) are not met (non-ideal wafer), the present invention has the advantage to provide a substantially uniform polishing force $F_1'$.

The following explains how the forces $F_2'$ and $F_3'$ are applied by the improved polishing of the present invention.

Figure 3:
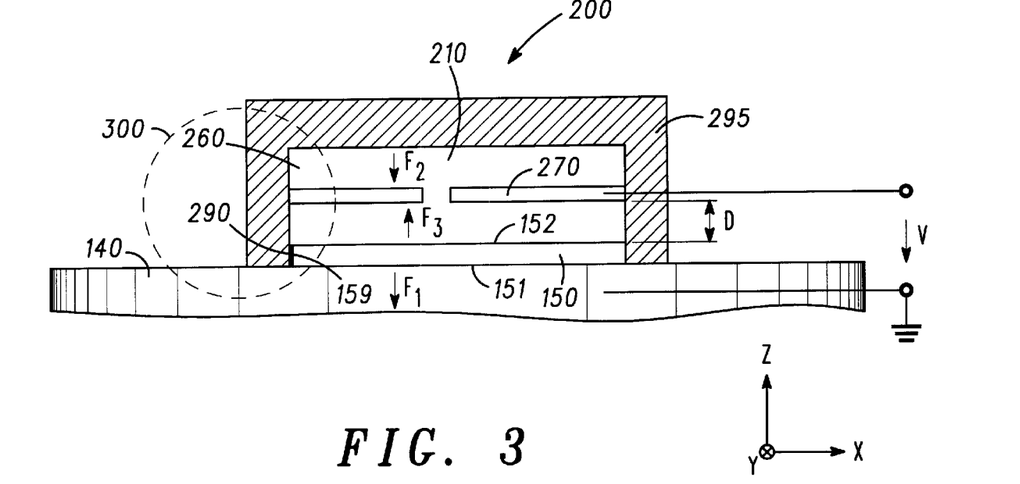
FIG. 3 illustrates a simplified diagram of a polishing head according to the present invention.

FIG. 3 illustrates a simplified diagram of polishing head 200 according to the present invention. More details are illustrated in connection with FIG. 7 for part 300 indicated in FIG. 3 by a dashed circle. Elements having reference numbers 140 (pad), 150, 151, 152 (wafer) which do not belong to head 200 have already been introduced in previous in FIGS. 1–2. For convenience, slurry is not shown. A CMP machine according to the present invention can be provided by replacing head 100 of machine 101 (cf. FIG. 1) by head 200 (cf. FIGS. 3–9).

Polishing head 200 has housing 295 (or "chuck") enclosing pressure chamber 210. Chuck 295 retains wafer 150 to stay at the top of pad 140. Chamber 210 is filled with pressure transfer medium 260 (illustrated by dots, details later). Preferably, edge 159 of wafer 150 is sealed in order to keep chamber 210 pressurized.

During polishing, pressure P within chamber 210 is larger than the air pressure outside head 200 so that medium 260 presses wafer 150 against pad 140 (details later). In other words, pressure chamber 210 provides down force $F_2$ (cf. FIG. 2).

According to the present invention, electrode arrangement 270, located preferably within chamber 210, is arranged coplanar to wafer 150. For obtaining the above mentioned correction force $F_3$, wafer 150 is electrically coupled to a first electrical potential (e.g., ground), for example, through pad 140 and conductive slurry 142 (not shown, cf. FIG. 1). In an alternative, it is also possible to apply the first potential to wafer 150 through an electrical contact 290, for example, at edge 159 of wafer 150 (cf. FIG. 7).

Electrode arrangement 270 is electrically coupled to a second electrical potential (e.g., voltage V) and substantially isolated from wafer 150 by medium 260. Upon application of voltage V, the wafer/electrode capacitor provides electrostatic force $F_3$. Distance D between wafer backside 152 and electrode arrangement 270 depends on the applied voltage V and is required to be small enough to provide sufficient electrostatic force $F_3$.

Forces $F_3$ and $F_2$ are of a different type; $F_3$ is, preferably, an electrostatic force, while force $F_2$ is a pneumatic or hydraulic force.

In other words, the present invention provides polishing head 200 for polishing semiconductor wafer 150 by pressing wafer 150 with frontside 151 to pad 140. Head 200 comprises (i) a first means for applying a first force (i.e. $F_2'$) substantially equally to the backside of the wafer, and a second means for locally providing a second force (i.e. $F_3'$) locally which counteracts on the first force so that wafer 150 is pressed to pad 140 by a resulting third force (i.e. $F_1'$, cf. statement (12)).

Preferably, the first means is implemented by chuck 295 with pressure chamber 210 and the second means is implemented by electrode arrangement 270 providing the second force electrostatically.

Figure 4A:
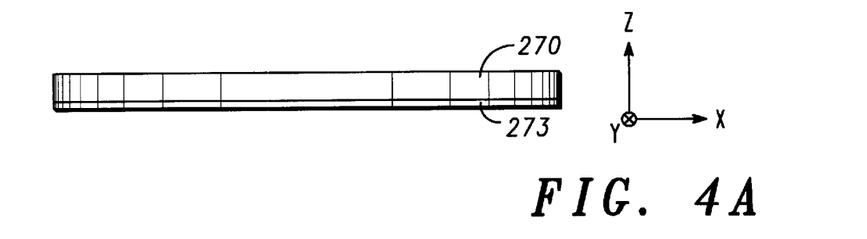
FIGS. 4AB illustrate simplified diagrams of an electrode arrangement in the polishing head of FIG. 3.
Figure 4B:
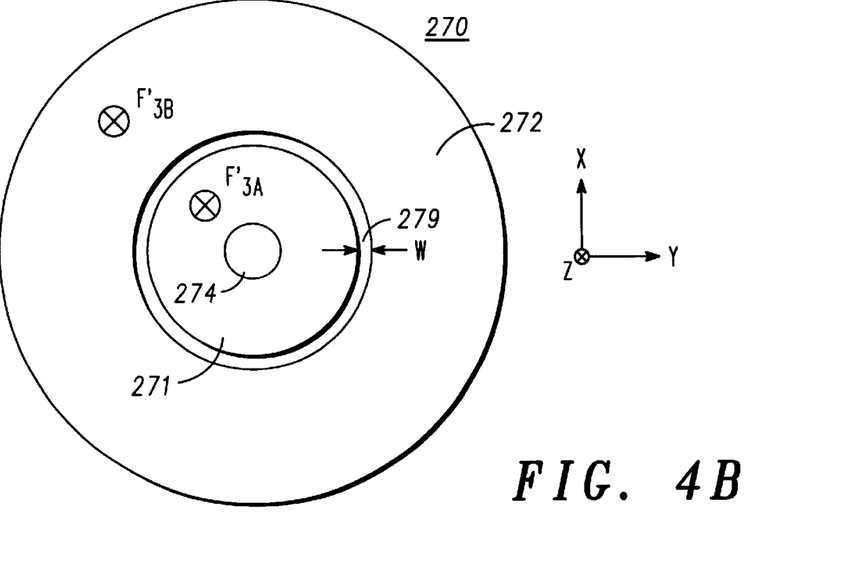

Preferably, electrode arrangement 270 has recesses to be permeable for medium 260 (details in FIGS. 4AB). Transfer medium 260 (cf. resilient member 134 in FIG. 1 e.g., a film) provides contact-less transfer of force $F_2$ (i.e. pressure P) from chuck 295 to backside 152. Medium 260 is dielectric.

There are basically two options for the choice of medium 260. Those of skill in the art can implement the options alone or in combination without the need of detailed explanation herein.

In the first option, medium 260 is gaseous so that force $F_2$ is pneumatically applied to backside 152 of wafer 150. Useful are, for example, clean dry air or nitrogen.

In the second option, medium 260 is a liquid so that force $F_2$ is hydraulically applied to backside 152 of wafer 150. Useful is, for example, deionized water (being a dielectric).

Convenient values for $F_2$ (overall for the complete wafer) are, for example, given as pressure $P_2$, in the range between 5 to 80 kilo Pascal.

It is an advantage of the present invention, that a rotation of head 200 (cf. C-direction in FIG. 1) is not required. When head 200 is used in a CMP machine with a rotation table (cf. table 120 in FIG. 1, B-direction), the friction between frontside 151 and pad 140 forces wafer 150 to rotate at substantially the same rotational speed as pad 140. The contact less approach provides that there is substantially no friction between chuck 295 and backside 152. Having wafer and table rotating with substantially the same rotational speed (e.g., 10 . . . 200 rotations per minute, or faster) is highly desirable because the relative speed between wafer and pad becomes substantially equal across the whole wafer surface, thus supporting a uniform material removal.

FIGS. 4AB illustrate simplified diagrams of an electrode arrangement 270 in polishing head 200 of FIG. 3, conveniently viewed as in FIG. 3 (Y-direction, FIG. 4A) and from below (Z-direction, FIG. 4B). FIGS. 4AB are intended to be a non-limiting example for explanation; those of skill in the art can apply the teachings herein to other embodiments.

Arrangement 270 comprises—in a concentric arrangement—inner electrode 271 ("sector index A") and outer electrode 272 ("sector index B") that are ring-shaped. Recess 274 (cf. FIG. 3) is illustrated in the center, but can be placed elsewhere.

Isolation is provided by gap 279 (width W) between the electrodes. Gap 279 can also serve as recess 274. Those of skill in the art can calculate width W and distance D (cf. FIG. 3) taking into account minimum clearance and creepage distances to prevent electrical sparkover or other detrimental effects.

To enhance isolation across distance D (between backside 152 and arrangement 270, cf. FIG. 3), electrode arrangement is preferably coated by isolation layer 273 made, for example, from polyimide.

The shape of the electrodes corresponds to the irregularities (e.g., of wafer 150, chuck 295, or medium 210) to be compensated. Hence, the ring structure of FIGS. 4AB is intended to be only an non-limiting example that is convenient for explanation, but not essential for the present invention. Persons of skill in the art can provide other electrodes, for example, having the form of triangles, rectangles (e.g., squares), hexagons or other polygons. Further examples are given in FIGS. 8ABC.

Having electrode arrangement 270 with at least two separate electrodes 271 and 272 (sectors A, B) is an important advantage of the present invention that allows the electrostatic force $F_{3A}'$ provided by electrode 271 to be different from the electrostatic force $F_{3B}'$ provided by electrode 272.

Since $F_3'$ depends on the applied voltage V (cf. FIG. 3) and on the distance D, this can accomplished by variations of voltage and distance, alone or in combination ($F_2$ assumed to be constant).

For example, for a voltage $V_A$ (applied to electrode 271, force $F_{3A}'$) being larger than a voltage $V_B$ (electrode 272, $F_{3B}'$), the resulting polishing forces relate to each other as $|F_{1A}'|<|F_{1B}'|$ (cf. statement 12). In other words, the different forces provide polishing of the center to a lesser degree than polishing of the periphery. Irregularities of the wafer can therefore be compensated.

A similar result can be obtained by a variation of distance D (for example, $D_A<D_B$) . This allows to select electrode arrangements suitable for a certain wafer lot.

Figure 5:
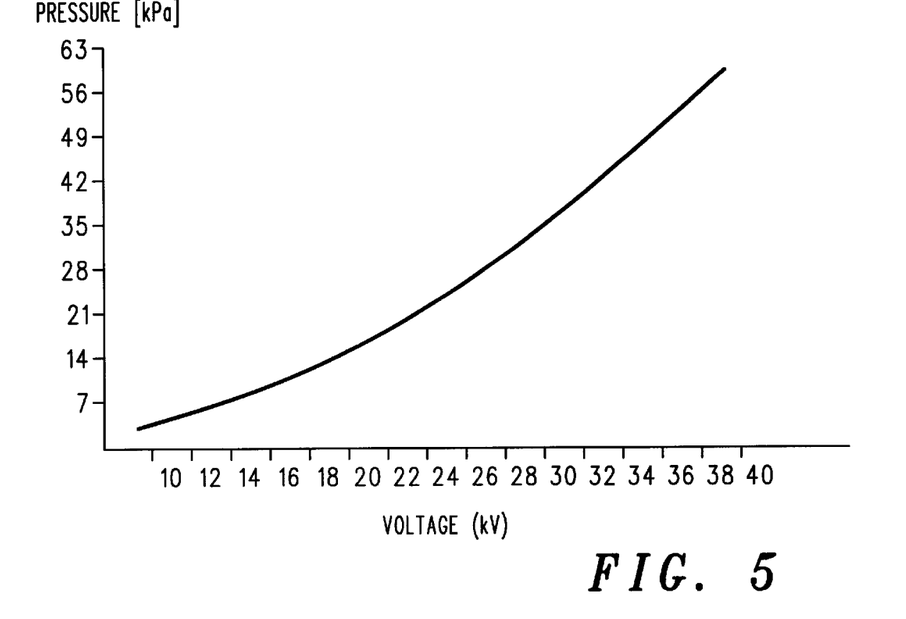
FIG. 5 illustrates a simplified diagram of the relation between a pressure provided in the head of FIG. 3 by the electrode arrangement and the distance between electrode and wafer.
Figure 6:
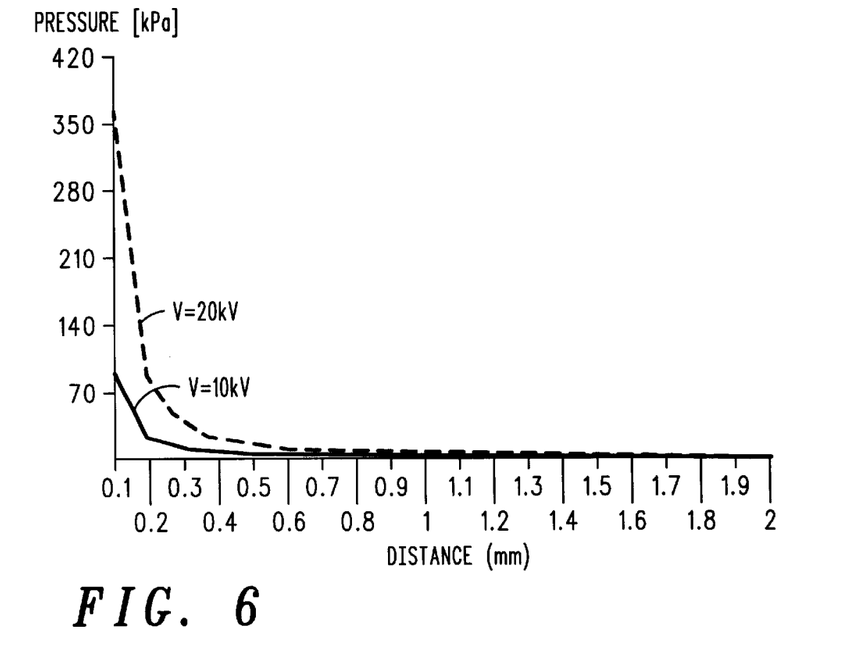
FIG. 6 illustrates a simplified diagram of the relation between pressure caused by application of the electrostatic force to the wafer and the applied voltage.

The following diagrams in FIGS. 5–6 indicate relations between pressure $P_3$ and voltage V (FIG. 5) as well as pressure $P_3$ and distance D (FIG. 6) under the assumptions (i) that arrangement 270 has a single electrode with the same diameter as wafer 150 ($P_3=F_3/(\pi*0.25*\text{diameter}$, e.g., diameter=300 milli meter) and (ii) that medium 260 is deionized water.

FIG. 5 illustrates a simplified diagram of the relation between pressure $P_3$ caused by application of the electrostatic force to wafer 150 and the applied voltage V. Useful values for V are in the range from 5 to 40 kilo volts (horizontal axis); and useful pressure values are in the range from 5 to 60 kilo Pascal (vertical axis).

FIG. 6 illustrates a simplified diagram of the relation between a pressure $P_3$ provided in head 200 of FIG. 3 by electrode arrangement 270 and the electrode-to-wafer distance D.

The vertical axis shows pressure $P_3$ in units of kilo Pascal (up to 350 kPa). The horizontal axis shows the distance D between wafer backside 152 and electrode 270 in milli meter. The relation is given for voltage V=10 kilo volts by a plain trace and for voltage V=20 kilo volts by a dashed trace.

Figure 7:
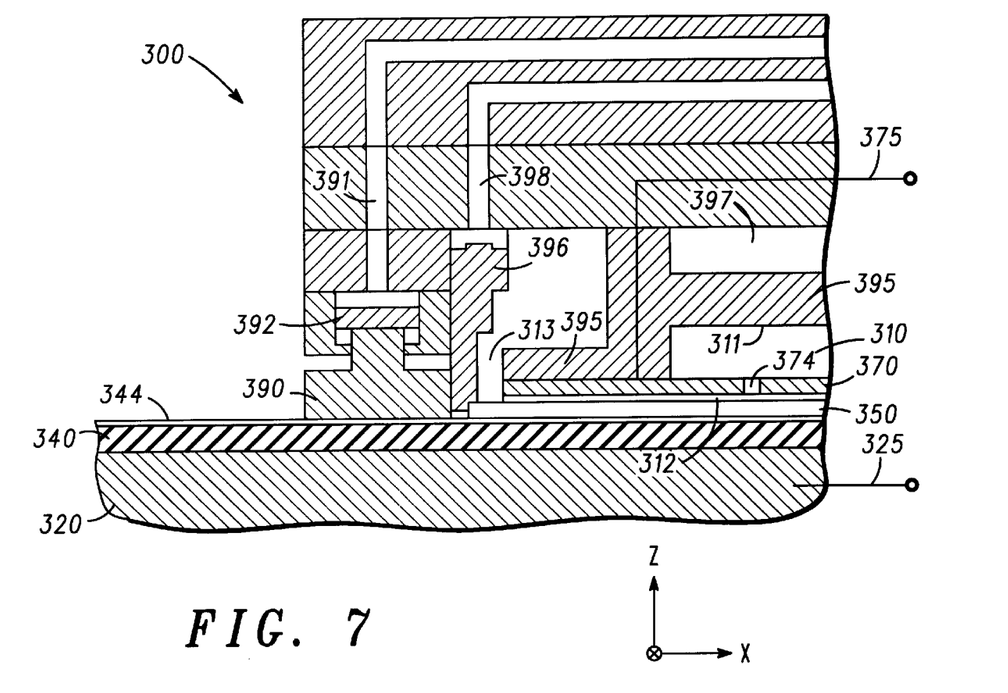
FIG. 7 illustrates a diagram with more detail of the head of FIG. 3 in a preferred embodiment of the present invention.

FIG. 7 illustrates a diagram with more detail of the head of FIG. 3 in a preferred embodiment of the present invention. For convenience, FIG. 7 also illustrate coordinate system XYZ. In FIGS. 1–4 and 7, reference numbers 200/300, 210/310, 120/320, 140/340, 144/344, 150/350, 270/370, 274/374, 290/390 and 295/395 stand for analogous components. However, their function can be different as a consequence of the embodiment which will be explained in more detail.

Polishing head 300 presses wafer 350 to polishing pad 340 of platen 320. Head 300 comprises electrode arrangement 370 (hatched \\\, with recess 374), pressure chamber 310 (e.g., filled with compressed air), retaining ring 390, wafer transport chuck 395, vacuum/pressure chamber 397, supporting element 396, air conducts 391, 398, piston 392, and high voltage cable 375.

Pressure chamber 310 has portion 3141 above electrode 370, portion 312 between wafer 350 and electrode 370 as well as portion 313 at the edge of wafer 350. Retaining ring 390 (preferably conductive) is pressed down by air conduct 391 and piston 392 to hold wafer 350. Chuck 395 (e.g., made of steel) encloses chamber 310. Vacuum/pressure chamber 397 moves chuck 395 up or down when wafer 350 is replaced by another wafer. Element 396 presses the edge of wafer 350 to pad 340 to hermetically seal wafer 350 when pressed down by air conduct 398. Adjusting the pressure in conducts 391, 398 and chamber 397 is known in the art and can be accomplished by a person of skill in the art without the need of detailed explanation herein.

Preferably, the electrical field is applied to the wafer/electrode capacitor through cable 325 attached to plate 320, conductive slurry 344 providing the first potential to wafer 350 and through cable 375 providing the second potential to electrode arrangement 370. Cable 375 has the appropriate number of wires to support multiple electrodes (cf. FIGS. 4AB, different second potentials). In an alternative, the first potential can also be applied through ring 390 (made of conductive material).

Figure 8A:
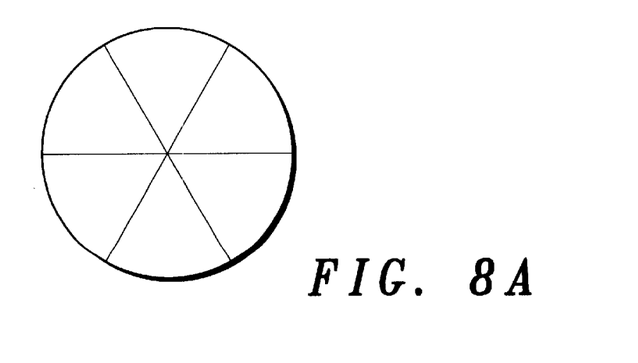
FIGS. 8ABC illustrate examples of further electrode configurations for the electrode arrangement.
Figure 8B:
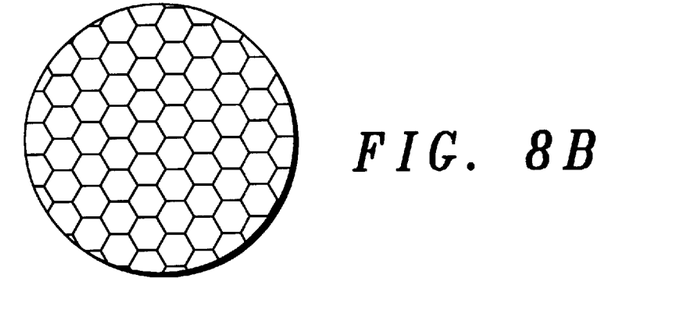
Figure 8C:
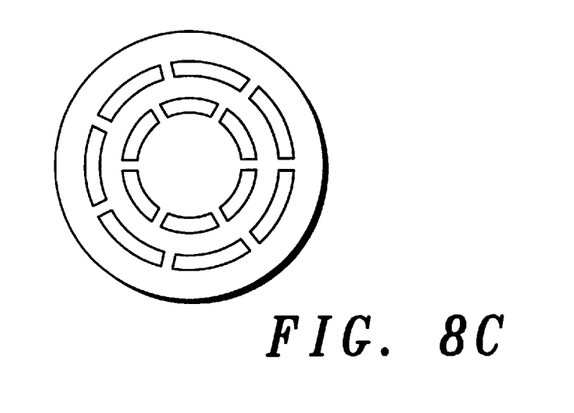

FIGS. 8ABC illustrate examples of further electrode configurations for the electrode arrangement. Illustrated are patterns having circle segments(A), hexagons (B) and multiple circle ring segments (C).

Figure 9:
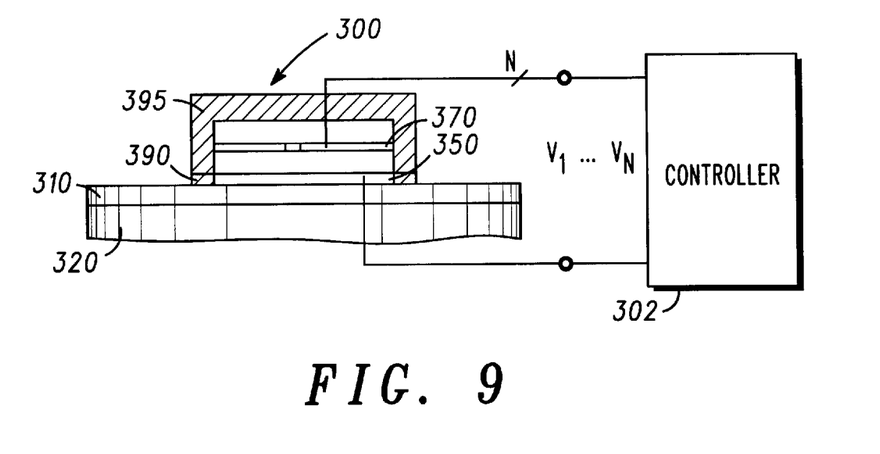
FIG. 9 illustrates a simplified diagram of a polishing apparatus using the head of FIGS. 3 and 7.

FIG. 9 illustrates a polishing apparatus 301 for polishing semiconductor wafer 350 using head 200/300 (cf. FIG. 3 and 7 ). Apparatus 301 comprises polishing table 320 being covered with polishing pad 340 and polishing head 300 having wafer holder 395 for retaining wafer 350 and at least one electrode 370 in holder 395 for applying an electrostatic force between polishing head 300 and wafer 350. Preferably, electrode 370 comprises several portions isolated to each other and separately receiving voltages $V_1$ to $V_N$ from controller 302 in respect to wafer 350. Optionally, electrically conductive polishing slurry can be provided between wafer 350 and polishing table 320 for applying an electric potential to the wafer.

The present invention can also be described as a method for polishing a semiconductor wafer wherein the wafer is pressed with the frontside to a pad. The method comprises the following steps (a) applying a first force (cf. $F_2$' in FIG. 2) substantially equally to the backside (cf. FIG. 2, down); and (b) locally applying a second force ($F_3$') in opposite direction (i.e. up) to counteract on the first force so that the wafer is pressed to the pad by a resulting third force ($F_1$', (cf. statement (12)). Preferably, the second force is applied by an electric field (cf. voltage V) between the wafer and an electrode arrangement (cf. 270 in FIG. 3) coplanar to the wafer.

While the invention has been described in terms of particular structures, devices and methods, those of skill in the art will understand based on the description herein that it is not limited merely to such examples and that the full scope of the invention is properly determined by the claims that follow.

What is claimed is:

1. A method for polishing a semiconductor wafer with a frontside and a backside, wherein said wafer is pressed with said frontside of said wafer to a pad, said method comprising the following steps:
   applying a first force substantially equally to said backside of said wafer; and
   locally applying a second force in opposite direction to said first force to counteract on said first force so that said wafer is pressed to said pad by a resulting third force.

2. The method of claim 1 wherein said second force is applied by an electric field between said wafer and an electrode arrangement coplanar to said wafer.

3. A polishing head for polishing a semiconductor wafer with a frontside and a backside, said head pressing said wafer with said frontside to a pad, said head comprising:
   a first means for applying a first force substantially even to said backside of said wafer; and
   a second means for locally providing a second force in opposite-direction to said first force, said second force to counteract on said first force so that said wafer is pressed to said pad by a resulting third force.

4. The polishing head of claim 1 wherein said first means is a chuck having a pressure chamber to transfer said first force by a pressure transfer medium.

5. The polishing head of claim 4, wherein said pressure transfer medium is a dielectric and wherein said second force is electrostatically applied to said wafer by an electrode arrangement within said chuck.

6. The polishing head of claim 4, wherein a first force is applied to said wafer for pressing a frontside of said wafer to a polishing pad through a medium, and wherein adjacent electrodes provide different forces opposite to said first force to locally change the resulting force by which said wafer is pressed to said pad.

7. The polishing head of claim 1 wherein said second means is an electrode arrangement having at least one electrode coplanar to said wafer to provide said second force electrostatically.

8. The polishing head of claim 7, wherein said electrode arrangement comprises several electrodes isolated to each other, and wherein the shape of the electrodes corresponds to irregularities to be compensated.

9. The polishing head of claim 8, wherein said several electrodes are in a concentric arrangement.

10. The polishing head of claim 9, wherein said several electrodes are ring-shaped.

11. The polishing head of claim 8, wherein said several electrodes have different distances to said wafer.

12. The polishing head of claim 7, wherein said electrode arrangement is isolated from said wafer by an isolation layer.

13. The polishing head of claim 7, wherein said wafer is electrically connected to a first potential by a retaining ring made of conductive material, and wherein said first potential is different from a second potential on said electrode arrangement.

14. The polishing head of claim 7, wherein said resulting third force is adjusted by applying a voltage between said electrode arrangement and said wafer.

15. The polishing head of claim 14, wherein said voltage is between 5 and 80 kilo volts.

16. The polishing head of claim 14, wherein said third force is adjusted for each electrode separately by applying partial voltages differently for each electrode.

17. A polishing head for a chemical-mechanical polishing machine that holds a semiconductor wafer against a polishing pad, comprising:
   a chuck with a pressure chamber to apply a down force substantially equally to the wafer backside; and
   an electrode arrangement within said chamber located coplanar to said wafer to provide compensation irregularities by applying a compensation force having a distribution of partial forces corresponding to said irregularities.

* * * * *

UNITED STATES PATENT AND TRADEMARK OFFICE
CERTIFICATE OF CORRECTION

PATENT NO.   : 6,375,549 B1  
DATED        : April 23, 2002  
INVENTOR(S)  : Walter Glashauser et al.

It is certified that error appears in the above-identified patent and that said Letters Patent is hereby corrected as shown below:

Column 8,  
Line 52, change "80" to -- 40 --.

Signed and Sealed this

Eighth Day of April, 2003

JAMES E. ROGAN  
*Director of the United States Patent and Trademark Office*